US008435084B2

(12) United States Patent
Caveney et al.

(10) Patent No.: US 8,435,084 B2
(45) Date of Patent: May 7, 2013

(54) COMMUNICATION JACK HAVING LAYERED PLUG INTERFACE CONTACTS

(75) Inventors: Jack E. Caveney, North Palm Beach, FL (US); Satish I. Patel, Roselle, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 13/360,899

(22) Filed: Jan. 30, 2012

(65) Prior Publication Data

US 2012/0129404 A1 May 24, 2012

Related U.S. Application Data

(63) Continuation of application No. 13/007,118, filed on Jan. 14, 2011, now Pat. No. 8,105,116, which is a continuation of application No. 11/955,699, filed on Dec. 13, 2007, now Pat. No. 7,874,877.

(60) Provisional application No. 60/869,834, filed on Dec. 13, 2006.

(51) Int. Cl.
*H01R 24/00* (2011.01)

(52) U.S. Cl.
USPC ............ 439/676; 439/829; 439/842; 439/941

(58) Field of Classification Search .................. 439/676, 439/829, 842, 941; 17/676, 829, 842, 941
See application file for complete search history.

(56) References Cited

U.S. PATENT DOCUMENTS

| | | | |
|---|---|---|---|
| 2,755,453 A * | 7/1956 | Cloutier ...................... | 439/741 |
| 4,367,907 A * | 1/1983 | Buck ........................... | 439/188 |
| 4,556,264 A | 12/1985 | Tanaka | |
| 4,720,269 A | 1/1988 | Haskins et al. | |
| 5,004,426 A * | 4/1991 | Barnett ....................... | 439/82 |
| 5,230,632 A | 7/1993 | Baumberger et al. | |
| 5,240,420 A | 8/1993 | Roberts | |
| 5,639,266 A * | 6/1997 | Patel ........................... | 439/676 |
| 5,716,237 A | 2/1998 | Conorich et al. | |
| 5,810,620 A | 9/1998 | Kobayashi et al. | |
| 5,957,734 A * | 9/1999 | Gladd et al. ................ | 439/857 |
| 5,971,806 A | 10/1999 | Evans et al. | |
| 6,220,900 B1 | 4/2001 | Huang | |
| 6,238,225 B1 * | 5/2001 | Middlehurst et al. ........ | 439/212 |
| 6,244,907 B1 | 6/2001 | Arnett | |
| 6,283,796 B1 | 9/2001 | Yeh | |
| 6,319,070 B1 | 11/2001 | Tan | |
| 6,360,437 B1 | 3/2002 | Fukumoto et al. | |

(Continued)

FOREIGN PATENT DOCUMENTS

EP 1643599 A1 4/2006

*Primary Examiner* — James Harvey

(74) *Attorney, Agent, or Firm* — Robert A. McCann; Christopher S. Clancy; Christopher K. Marlow

(57) ABSTRACT

A communication jack, system using the jack, and method of fabricating the jack are disclosed. The jack includes a cavity configured to accept a communication plug to form a communication connector. The jack includes a plurality of plug interface contacts that extend into the cavity such that a plug inserted into the cavity makes electrical contact with the plug interface contacts at plug/jack interfaces of the plug interface contacts. One or more of the plug interface contacts is formed from multiple conductive layers. The conductive layers are movable relative to each other at at least one end. A dielectric layer or flexible printed circuit board may be disposed between the conductive layers.

5 Claims, 13 Drawing Sheets

U.S. PATENT DOCUMENTS

| | | |
|---|---|---|
| 6,368,160 B2 | 4/2002 | Chang |
| 6,375,516 B1 | 4/2002 | Trinh |
| 6,402,560 B1 | 6/2002 | Lin |
| 6,409,547 B1 | 6/2002 | Reede |
| 6,722,926 B2 | 4/2004 | Chevassus-More |
| 6,767,257 B2 | 7/2004 | Arnett et al. |
| 6,974,329 B2 * | 12/2005 | Henneberg ............... 439/59 |
| 7,104,812 B1 * | 9/2006 | Bogiel et al. ............... 439/79 |
| 7,125,288 B2 | 10/2006 | Schilling |
| 7,601,034 B1 | 10/2009 | Aekins et al. |
| 7,874,877 B2 | 1/2011 | Caveney et al. |
| 8,105,116 B2 * | 1/2012 | Caveney et al. ........... 439/676 |
| 8,257,118 B2 * | 9/2012 | Bareel et al. ............ 439/676 |
| 2002/0002015 A1 * | 1/2002 | Mochizuki et al. ........... 439/660 |
| 2002/0009930 A1 | 1/2002 | Chang |
| 2002/0151201 A1 | 10/2002 | Bohbot |
| 2003/0109182 A1 * | 6/2003 | Miyazawa et al. ............ 439/886 |
| 2003/0129880 A1 | 7/2003 | Arnett et al. |
| 2004/0067693 A1 | 4/2004 | Arnett |
| 2005/0020134 A1 * | 1/2005 | Winings et al. ............... 439/608 |
| 2005/0181676 A1 | 8/2005 | Caveney et al. |
| 2005/0202697 A1 | 9/2005 | Caveney et al. |
| 2005/0277339 A1 | 12/2005 | Caveney et al. |
| 2006/0189222 A1 | 8/2006 | Bogiel et al. |
| 2007/0117469 A1 | 5/2007 | Caveney et al. |
| 2008/0146093 A1 | 6/2008 | Caveney et al. |
| 2009/0075523 A1 * | 3/2009 | Caveney et al. ............. 439/676 |
| 2011/0111645 A1 * | 5/2011 | Caveney et al. ............. 439/676 |
| 2012/0122352 A1 * | 5/2012 | Caveney ..................... 439/676 |
| 2012/0129404 A1 * | 5/2012 | Caveney et al. ............. 439/676 |

* cited by examiner

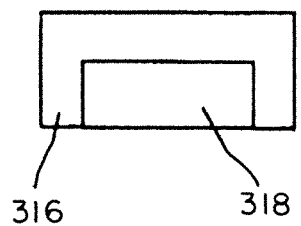
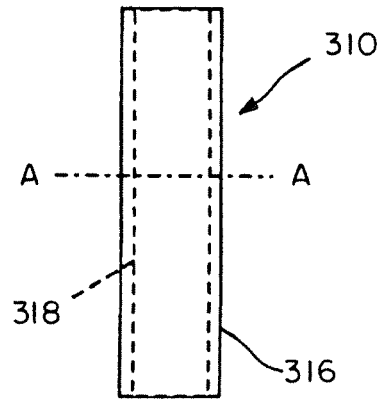
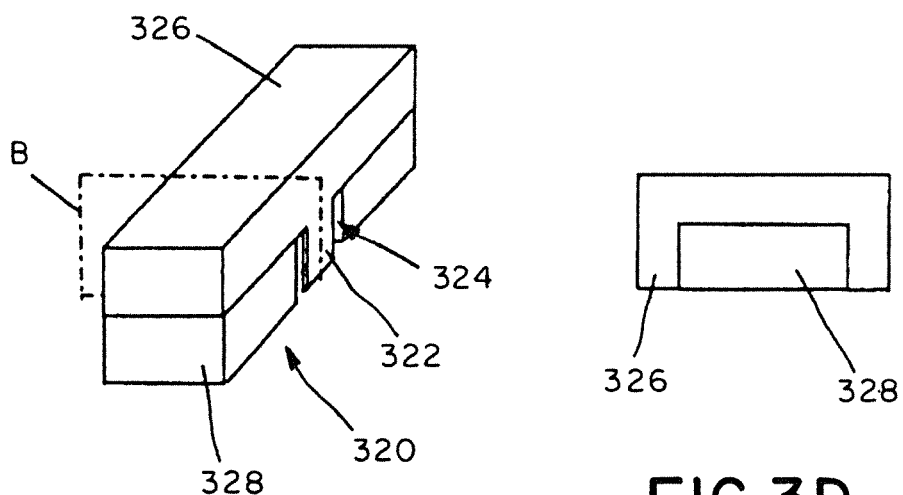
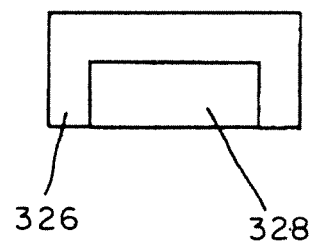
FIG. 3A
FIG. 3B
FIG. 3C
FIG. 3D

COMMUNICATION JACK HAVING LAYERED PLUG INTERFACE CONTACTS

CROSS-REFERENCE TO RELATED APPLICATION

This application is a continuation of U.S. patent application Ser. No. 13/007,118, filed Jan. 14, 2011, which is a continuation of U.S. patent application Ser. No. 11/955,699, filed Dec. 13, 2007, now U.S. Pat. No. 7,874,877, issued on Jan. 25, 2011, which claims priority to U.S. Provisional Patent Application Ser. No. 60/869,834, filed Dec. 13, 2006, the subject matter of which is incorporated herein by reference in its entirety.

FIELD OF THE INVENTION

The present invention is generally directed to communications jacks and more specifically directed to communications jacks having layered plug interface contacts.

BACKGROUND

In communications systems, cabled connections are established when the plugs at the ends of a cable are inserted into the jacks of the devices to be connected. Before insertion of the plug into the jack, metallic contacts in the jack are situated in a pre-insertion position. After insertion of the plug into the jack, the metallic plug interface contacts of the jack are situated in a post-insertion position in which they contact the metallic plug contacts of the plug.

After repeated insertions of plugs into the jacks, the plug interface contacts may not be able to retain their pre- or post-insertion position. This may cause problems in contacting the plug contacts when the plug interface contacts are supposed to be in their post-insertion positions.

The problem of the plug interface contacts retaining their positions may be exacerbated if different plugs are inserted into the jack. Different plugs may have different numbers of plug contacts. Although the number of plug contacts may be different, the size of the plug may remain the same independent of the number of plug contacts. This permits the cavity into which the plug is inserted also to be a standard size. The plug is formed such that the plug contacts are set back within insulating material and are thus electrically and physically isolated from each other. As the number of plug contacts decrease, the outermost plug contacts are eliminated, leaving the thickness of the plug in this area larger. Thus, for example, if a plug with six plug contacts is inserted into a jack having eight plug interface contacts, the two outermost plug interface contacts will be bent further than the six inner plug interface contacts. This stresses the plug interface contacts and may eventually lead to severe distortion of the pre- or post-insertion position. Thus, some of the plug interface contacts may be unable to contact plug contacts when plugs with the same number of plug contacts are inserted into the jack.

In either case, it is thus desirable to increase the mechanical robustness of the plug interface contacts.

SUMMARY

A communication jack, system using the jack, and method of fabricating the jack are disclosed. The jack includes a cavity configured to accept a communication plug to form a communication connector. The jack includes a plurality of plug interface contacts that extend into the cavity such that a plug inserted into the cavity makes electrical contact with the plug interface contacts at plug/jack interfaces of the plug interface contacts. One or more of the plug interface contacts comprises a plurality of conductive layers.

In one embodiment, the conductive layers contact each other in the cavity, or at the plug/jack interface, and are formed of the same material. In another embodiment, the conductive layers are restrained in a thickness direction of the conductive layers such that the conductive layers are able to move longitudinally relative to each other at at least one end of the conductive layers. In another embodiment, the conductive layers contact each other in the cavity or at the plug/jack interface and are able to move longitudinally relative to each other at at least one end of the conductive layers. In another embodiment, a dielectric layer may be disposed between the conductive layers. In another embodiment, a flexible printed circuit board may be disposed between the conductive layers at the plug/jack interface.

The individual embodiments described herein may be combined in various manners such that any of the features in an embodiment may be used in another embodiment, as desired.

BRIEF DESCRIPTION OF THE DRAWINGS

The invention is described in detail with reference to the following figures wherein like numerals reference like elements, and wherein:

FIGS. 3A and 3B show simplified cross-sectional and top views, respectively, of a first embodiment of a plug interface contact (PIC); and FIGS. 3C and 3D show simplified perspective and cross-sectional views, respectively, of a second embodiment of a PIC;

DETAILED DESCRIPTION OF EMBODIMENTS

Figure 1:
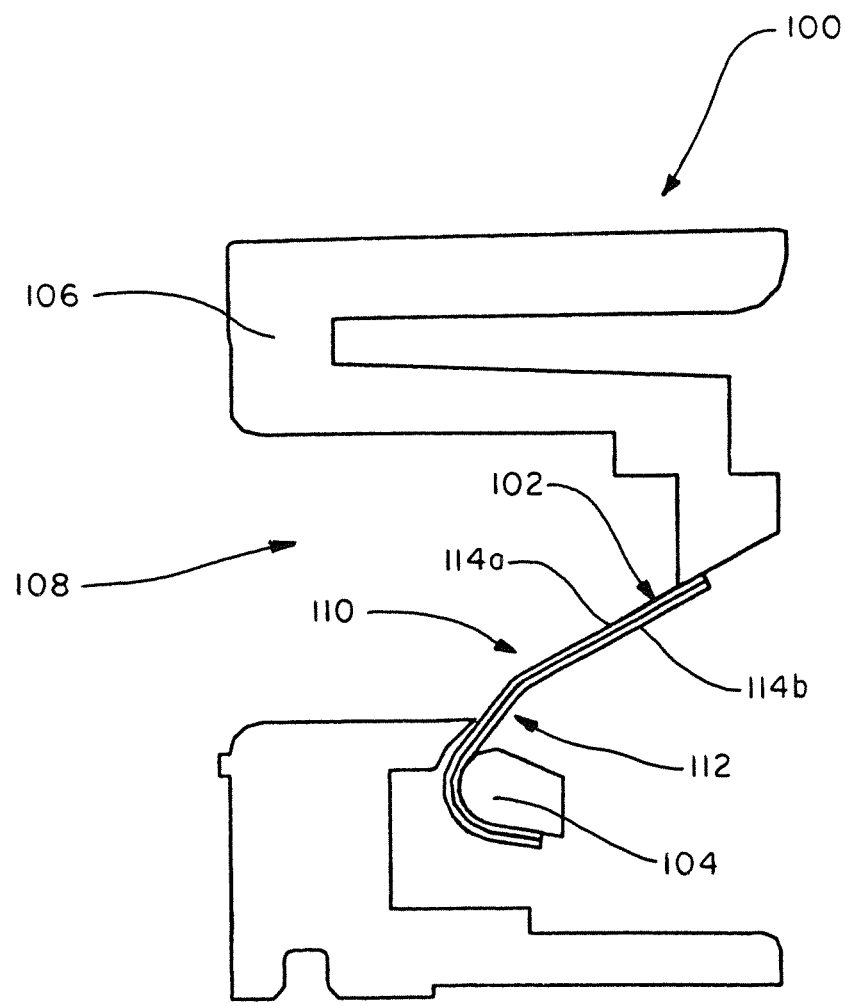
FIG. 1 shows a simplified cross-sectional view of a jack before insertion of a plug into the jack according to one embodiment.
Figure 2:
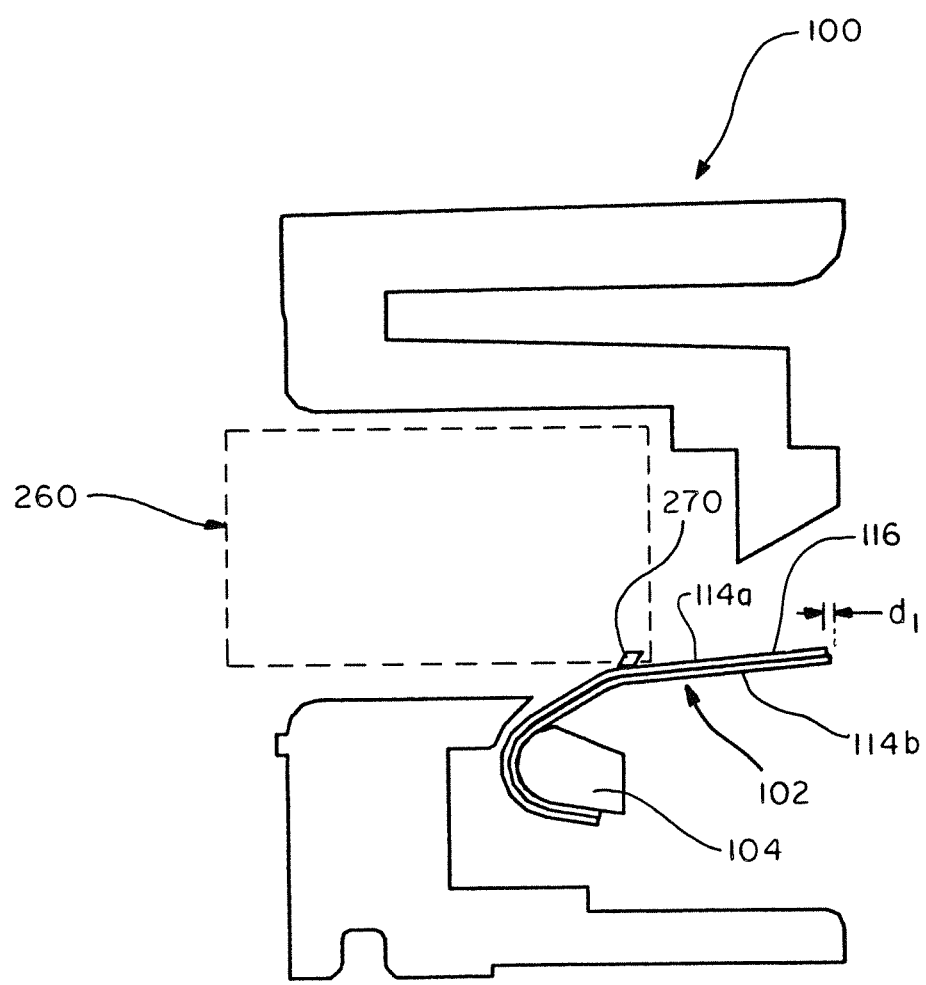
FIG. 2 shows the simplified cross-sectional view of the jack after insertion of a plug into the jack.

FIGS. 1 and 2 show simplified cross-sectional views of a jack 100 before and after insertion of a plug into the jack 100 according to one embodiment. The jack 100 includes a main housing 106 and a sled 104 arranged to support the plug interface contacts 102. The sled 104 may be formed from one or more pieces. The main housing 106 and sled 104 are formed from one or more insulators and form a cavity 108 into which the plug is inserted. The plug interface contacts 102 are electrically connected to a rigid printed circuit board (PCB) such as through a flexible printed circuit (FPC) at one or more points along the plug interface contacts 102. IDCs (Insulation Displacement Contacts) engage the PCB from the rear via through-holes in the PCB. In other embodiments, the plug interface contacts may contact the IDCs without the use of one or both of the PCB and FPC. A rear housing having passageways for the IDCs and a wire cap serve to provide an interface to a twisted pair communication cable or punch-down block. Some of these features, although not present in FIG. 1 or 2, are illustrated in the various embodiments of FIGS. 6-18.

The plug interface contacts 102 are illustrated in a pre-insertion position in FIG. 1. Although the plug interface contacts 102 are shown as contacting the insulating jack housing 106 in the pre-insertion position, in other embodiments they may not contact the jack housing 106. In the illustrated embodiment, each plug interface contact 102 comprises a combination of a cantilevered portion 110 and a curved portion 112. The curved portion 112 is retained by the sled 104. When the plug interface contacts 102 are bent, there is a concentration of mechanical stress at or near the location of constraint. When the stress exceeds the elastic limit of the materials forming the plug interface contact 102, a contact permanent set occurs. The shape of the plug interface contact 102 then becomes distorted and may adversely affect electrical contact between the plug contacts of the plug and the plug interface contact of the jack, resulting in intermittent contact in some cases or lack of contact in other cases.

One way to prevent contact permanent set is to decrease the thickness of the plug interface contact 102. However, if the thickness of the plug interface contact 102 is reduced, the contact normal force (i.e., the resistance to displacement) is also reduced. To retain the desired contact normal force while simultaneously decreasing the possibility of permanent set, the plug interface contact 102 comprises multiple conductive layers 114a, 114b, which are individual (separate) layers of conductive strips. Although only two conductive layers 114a, 114b are illustrated, any number can be present. The conductive layers 114a, 114b contact each other in the cavity 108 at or near the plug/jack interface (i.e., where the plug contacts make electrical and mechanical contact with the plug interface contacts of the jack) and/or the location of maximum mechanical stress. Although the conductive layers 114a, 114b are shown as being the same size, they may have different lengths, widths, or thicknesses depending on the desired characteristics. Various advantages of forming the conductive layers 114a, 114b with different dimensions will be described with reference to specific embodiments below.

The conductive layers 114a, 114b may be formed of the same conductor or different conductors. Examples of the various conductors used to fabricate the conductive layers 114a, 114b include metals such as copper, aluminum, gold, silver, and alloys thereof (e.g., bronze), stainless steel, or generally insulating materials that have been impregnated with conductive particles. While it may be advantageous in certain circumstances to use different materials, permanent lamination of different materials by various methods may be problematic and change the characteristics of the structure. Also, the use of different materials may cause the galvanic effect (corrosion) to occur. Accordingly, in some embodiments it may be preferable to fabricate the plug interface contact 102 from conductive layers 114a, 114b of the same material.

The conductive layers 114a, 114b may be disposed to contact each other such that they have a desired thickness at a particular location. This location can include the position of maximum stress of the plug interface contact 102 and/or the plug/jack interface. The conductive layers 114a, 114b may be stamped from a layered set of raw materials or may be stacked during assembly of the jack 100. All or only some of the plug interface contacts 102 may be formed from the conductive layers 114a, 114b. Similarly, different plug interface contacts 102 may be formed from one or more different sets of materials.

FIG. 2 illustrates the insertion of a plug 260 into the cavity 108 of the jack 100. In the figure, the plug 260 is inserted far enough into the cavity 108 such that the plug contacts 270 contact and push the plug interface contacts 102 of the jack 100 to the post-insertion position. The conductive layers 114a, 114b may be disposed to contact each other such that they have a desired thickness at a particular location.

The conductive layers 114a, 114b may not be attached throughout the conductive layers 114a, 114b. In this case, the conductive layers 114a, 114b slide against each other when the plug 260 makes contact with the top (or outer) conductive layer 114a of the plug interface contacts 102. This sliding action, along with the reduced thickness of the individual conductive layers 114a, 114b, permits each conductive layer 114a, 114b to withstand the displacement load supplied by the plug 160 without being permanently deformed. In some embodiments, as the conductive layers 114a, 114b displace downward with plug insertion, the bottom (or inner) conductive layer 114b extends further relative to the top conductive layer 114a causing a displacement $d_1$ as shown in FIG. 2. In one embodiment, the conductive layers 114a, 114b are not attached to each other at any point. In other embodiments, the conductive layers 114a, 114b may be attached at or near one of the ends, i.e., the end retained by the sled 104 or the end disposed in the cavity 108. The conductive layers 114a, 114b can be attached by any means, such as welding, solder, a fastener, or an adhesive. Alternatively, or in addition, the conductive layers 114a, 114b can be attached at one or more regions or otherwise restrained in the thickness direction so long as the conductive layers 114a, 114b are able to sufficiently slide relative to each other and provide the desired contact normal force. For example, one end of the plug interface contacts may be soldered to a printed circuit board (PCB) retained in the sled 104.

One or more of the conductive layers may be constrained in the lateral (width) direction, thereby reducing the possibility of contacting other conductive layers. FIGS. 3A and 3B are a cross-sectional and top view, respectively, of a first embodiment in which one of the conductive layers 316 constrains another of the conductive layers 318 along substantially the entire length of the conductive layers 310. FIG. 3A is a cross-section taken along A-A of FIG. 3B. FIGS. 3C and 3D are a perspective view and a cross-sectional of a second embodiment in which one of the conductive layers 326 (the constraint) constrains another of the conductive layers 328 (the constrained layer) at one or more locations of the conductive layers 320. In the second embodiment, the constrained layer 328 has a notch 324 in one or both sides and the constraint 326 has a tab 322 that fits into each notch 324. The cross section of FIG. 3D is taken from a portion of the second embodiment where the tab 322 and notch 324 overlap. FIG. 3D is a cross-section taken along plane B of FIG. 3C.

In other embodiments (not shown), the constraint 326 may have one or more tabs but the constrained layer 328 may not have a notch. Alternatively, the conductive layers may be restrained laterally without using one or more notches or tabs via, e.g., one or more bands of insulating material that at least partially surround the conductive layers of one or more of the plug interface contacts. Such a band may not interfere substantially with the ability of the conductive layers to slide with respect to each other in the longitudinal direction. In embodiments with or without such a band, the plug interface contacts may be separated by an insulator (e.g., plastic) such that the plug interface contacts are electrically and mechanically isolated from each other.

Figure 4:
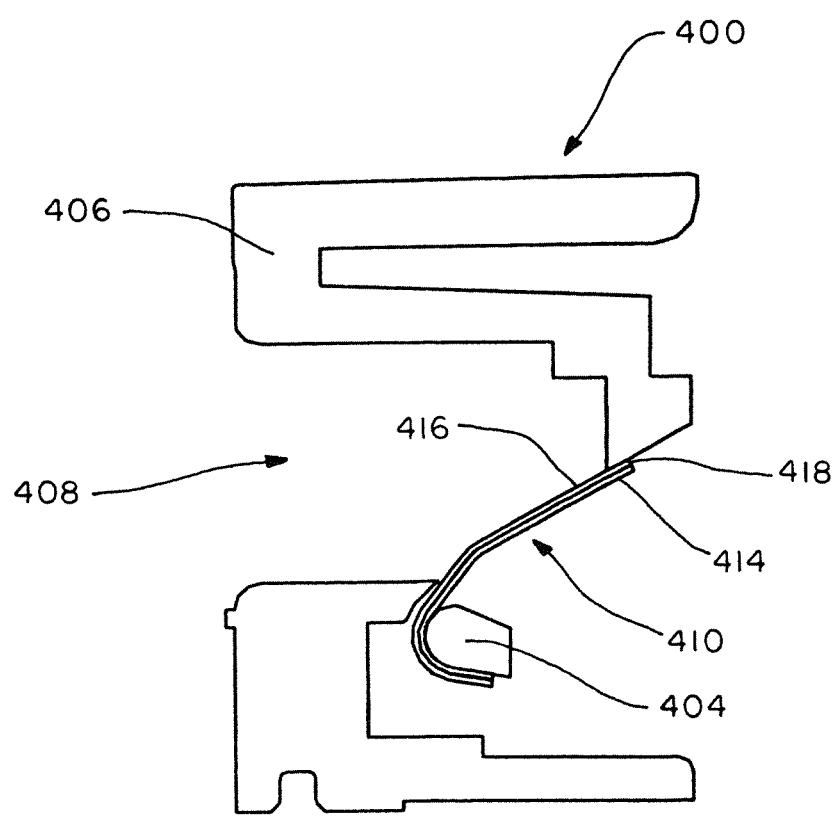
FIG. 4 shows a simplified cross-sectional view of a jack before insertion of a plug into the jack according to one embodiment.

Another embodiment of the jack is shown in the simplified cross-sectional view of FIG. 4. In this figure, as in FIG. 1, the jack 400 is shown prior to insertion of a plug. The jack 400 includes a main housing 406 and a sled 404 arranged to support the plug interface contacts 410. The main housing 406 and sled 404 form a cavity 408 into which the plug is inserted. The plug interface contacts 410 include conductive layers 414, 416 that are separated by a dielectric layer 418. As above, although only two conductive layers and one dielectric layer are shown, any number of layers may be present. The conductive layers 414, 416 may be formed from the same material or different materials, and have the same or a different size. The dielectric layer 418 may be formed from one or more layers of the same material or different materials.

The conductive layers 414, 416 and dielectric layer 418 may form a tuning capacitor. In the capacitor, the outer conductive layer 416 contacts the plug contacts of the plug and is connected to a first pin contact in the FPC or PCB (not shown). The inner conductive layer 414 is connected to a second pin contact in the circuit board. The conductive layers forming the capacitor may transition to the proper pin in the area below the cavity 408. For example, the outer conductive layer of the third plug interface contact may be connected to the third pin contact on the circuit board, while the inner conductive layer of the third plug interface contact (and the outer conductive layer of the fifth plug interface contact) is connected to the fifth pin contact, thereby creating a 3-5 contact capacitor. Such a capacitor can be used to tune the 45-36 pair of the plug. Reducing the width of one (e.g., inner) conductive layer of the capacitance relative to the other (e.g., outer) conductive layer may help to eliminate problems due to large potential differences between the contact layers. The connection between the inner conductive layer and a particular pin may be designed to avoid interfering with the movement of the plug or creating short circuits with other pins.

As in the previous embodiment, the conductive layers 414, 416 and dielectric layer 418 may be free to move relative to each other or may be restrained in one or more directions. In addition, as indicated above, although the conductive layers 414, 416 and dielectric layer 418 are shown as extending along the entire length of the various layers, one or more of the layers may be limited in one or more dimensions. For example, one of the conductive layers may be thinner or narrower than the other conductive layer, or the dielectric layer can be the same thickness or a different thickness from the conductive layers. As the width of one of the conductive layers or the dielectric layer decreases, the parallel-plate capacitance between the conductive layers likewise decreases. The conductive layers and/or dielectric layer may also be provided in one or more local areas of the plug interface contact, thereby altering the electrical and mechanical properties of the plug interface contact.

In addition to mechanical robustness of the plug interface contacts, it is also desirable to provide favorable electrical characteristics, such as a reduction in cross-talk (noise) of the connector. An extensive discussion of noise suppression in connectors may be found in U.S. patent application Ser. No. 11/180,216, entitled "Communication Connector With Flexible Printed Circuit Board," filed Jul. 13, 2005, which is incorporated herein by reference in its entirety. The effectiveness of noise compensation circuitry increases with decreasing distance from the plug/jack interface.

Figure 5:
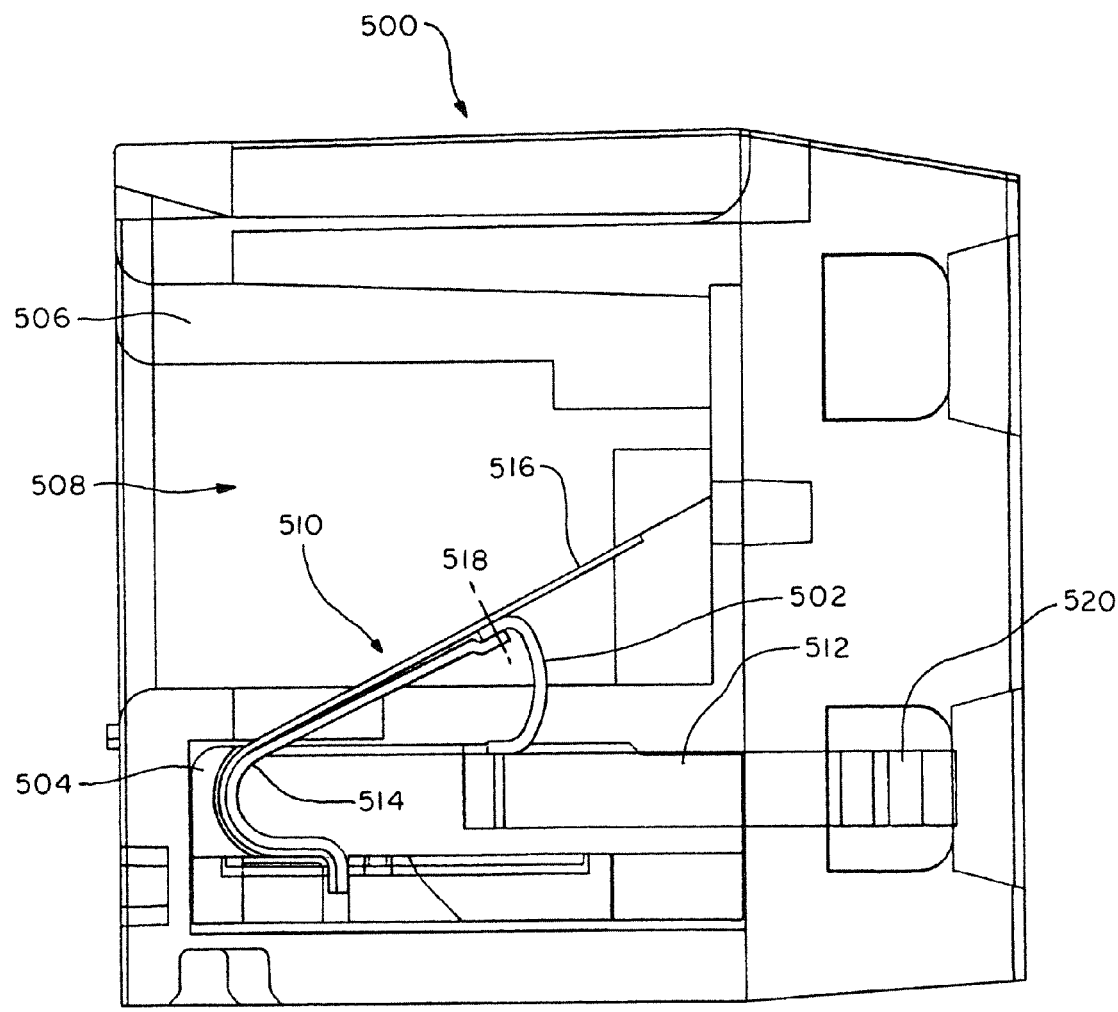
FIG. 5 shows a cross-sectional view of a jack before insertion of a plug into the jack according to one embodiment.
Figure 6A:
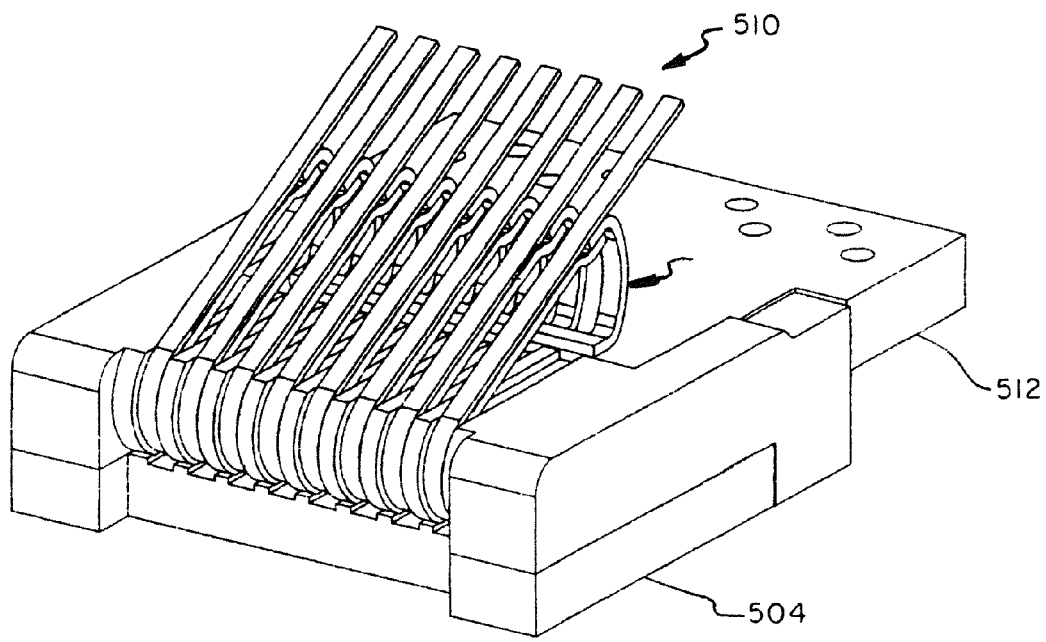
FIGS. 6A and 6B show a perspective and cross-sectional view, respectively, of the sled of FIG. 5.
Figure 6C:
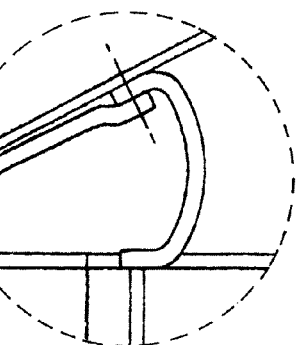
FIG. 6C shows an enlarged view at the plug/interface contact.
Figure 6B:
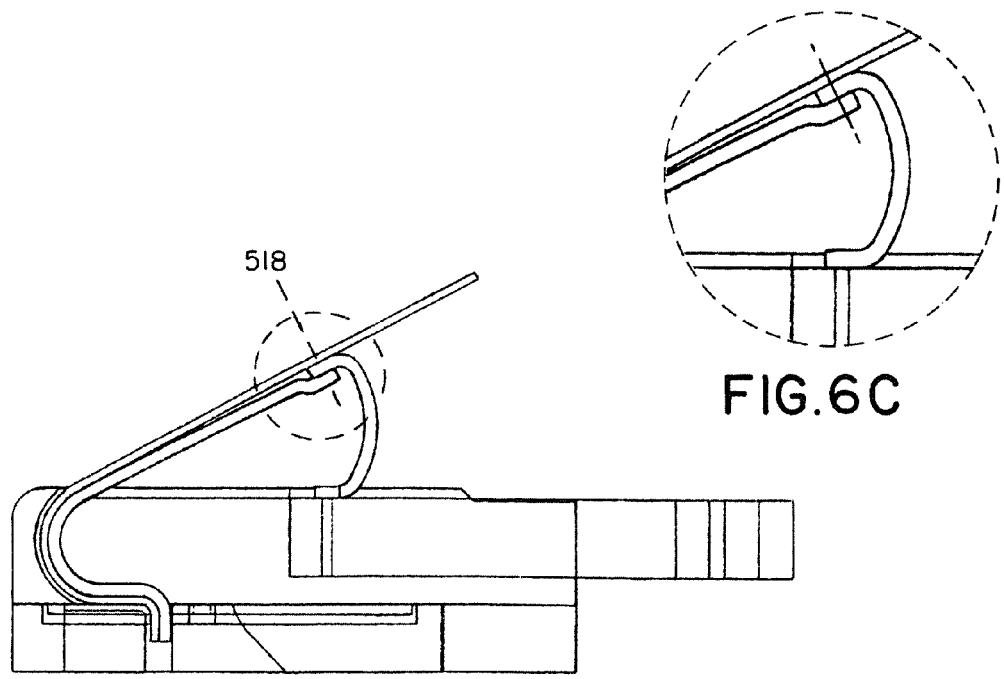

A cross-sectional view of another embodiment of the jack is shown in FIG. 5, with perspective and cross-sectional views of the sled being shown in FIGS. 6A-6C. In this figure, the jack 500 is shown prior to insertion of a plug. The jack 500 includes a main housing 506 and a sled 504 arranged to support the plug interface contacts 510. The main housing 506 and sled 504 form a cavity 508 into which the plug is inserted. The plug interface contacts 510 include conductive layers 514, 516 and a flexible printed circuit (FPC) 502 disposed between the conductive layers 514, 516. Specifically, one end of the FPC 502 is sandwiched between the conductive layers 514, 516 in the cavity 508 essentially only at the plug/jack interface 518. The other end of the FPC 502 is connected, e.g., via solder, to a PCB 512 retained by the sled 504. Using such a configuration reduces the amount of current flowing in the plug interface contacts 510, since the contact/FPC interface is located at the plug/jack interface 518. This decreases a source of crosstalk and other noise. The flexibility of the FPC 502 allows it to be connected to all the plug interface contacts 510, which do not move exactly in unison when a plug is inserted. The FPC 502 may be disposed between adjacent plug interface contacts 510 or may be formed in a comb shape such that the portion in contact with the PCB 512 is substantially rectangular while individual elements extend from the rectangular portion to make contact with the individual plug interface contacts 510.

As shown, the top conductive layer 516 is thinner than the bottom conductive layer 514, although the conductive layers 514, 516 may have the same thickness in other embodiments. The bottom conductive layer 514 may have an offset configured to retain the FPC 502. Such an arrangement helps to minimize the length from the plug/jack interface 518 to the PCB 512. Holes 520 in the PCB 512 may contain insulation displacement contacts (IDCs). The ends of one or both of the conductive layers 514, 516 proximate to the FPC 502 may be curved and/or milled to remove sharp corners or burrs and thereby reduce the possibility of damage to the FPC 502. The conductive layers 514, 516 may be free or restrained as indicated above. If the conductive layers 514, 516 are restrained, they may be restrained in one or more locations as described or may be restrained essentially throughout the length of the plug interface contact 502. The FPC 502 may contain, for example, contact pads, current carrying traces, and capacitive and/or inductive areas in various locations.

The PCB can be disposed in other locations within the jack, so long as electrical communication is able to be effectuated between the plug and the PCB via the plug interface contacts and FPC.

Figure 7:
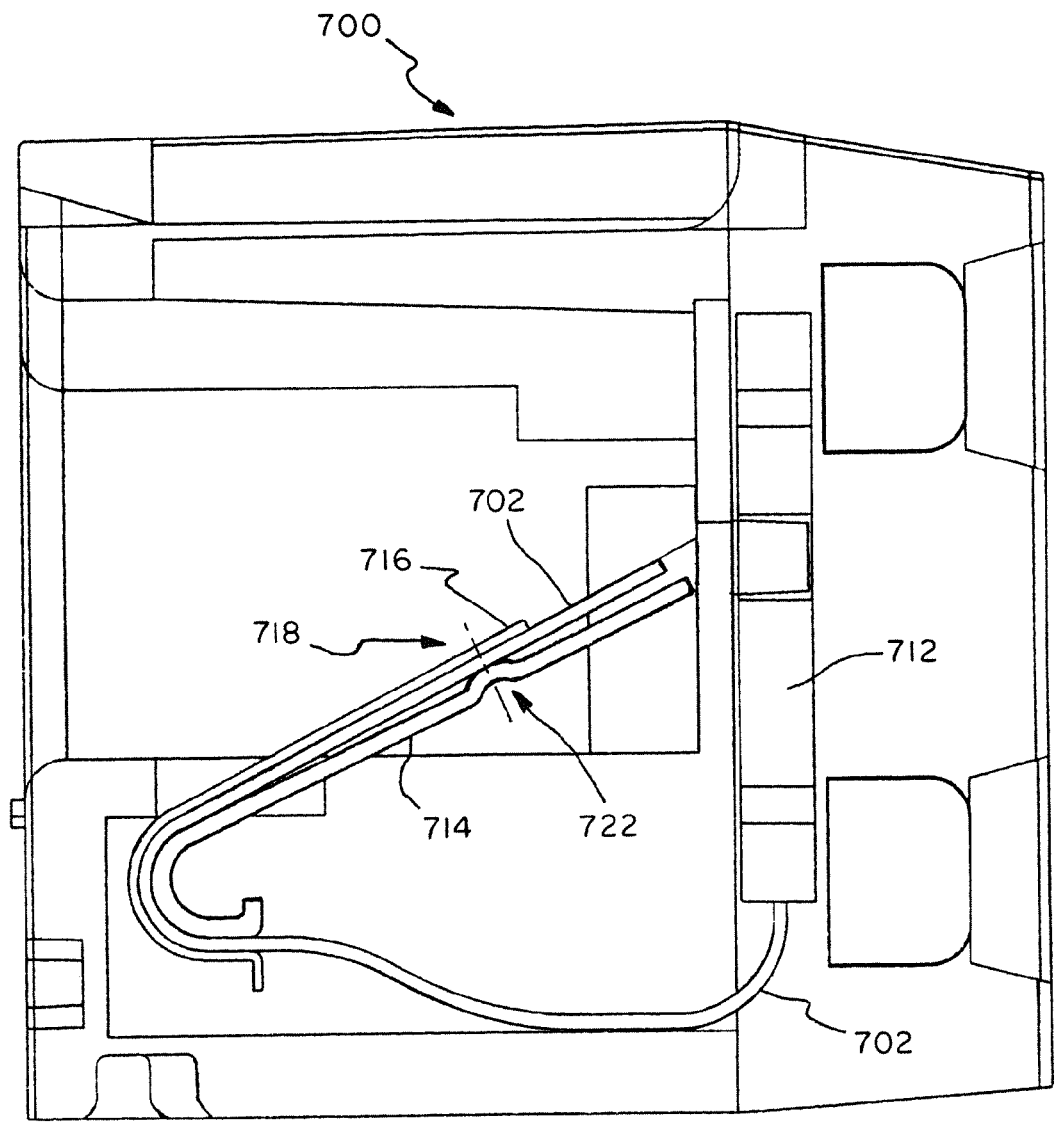
FIG. 7 shows a cross-sectional view of a jack before insertion of a plug into the jack according to one embodiment.

FIGS. 7-13 show different embodiments of layered contacts and PCB placements according to the present invention. In FIGS. 7-13, like elements are given similar reference numerals. A cross-sectional view of an embodiment of a jack 700 in which the PCB 712 is disposed vertically (i.e. perpendicular to the direction of plug movement), rather than horizontally (i.e. parallel to the direction of plug movement) is shown in FIG. 7. In this figure, the jack 700 is shown prior to insertion of a plug. The plug interface contacts 710 include conductive layers 714, 716 and a flexible printed circuit (FPC) 702 disposed between the conductive layers 714, 716. The FPC 702 is sandwiched between the conductive layers 714, 716. One end of the FPC 702 is connected to a vertically disposed PCB 712.

When a plug (not shown) is inserted into the cavity, the plug contacts (not shown) of the plug communicate with the FPC 702 at the plug/jack interface 718 through contact pads on the FPC 702. As illustrated in this embodiment, the bottom conductive layer 714 is longer than the top conductive layer 716, allowing for inter-contact capacitance to be added at the end of the FPC 702 near the plug/jack interface 718. The bottom conductive layer 714 also has a raised area 722 at the plug/jack interface 718. The raised area 722 is curved in an arc that contacts the FPC 702 and increases the normal force of the bottom contact 714 on the contact pads/traces of the FPC 702. In another embodiment, the top conductive layer 716 may be longer than the bottom conductive layer 714.

Figure 8:
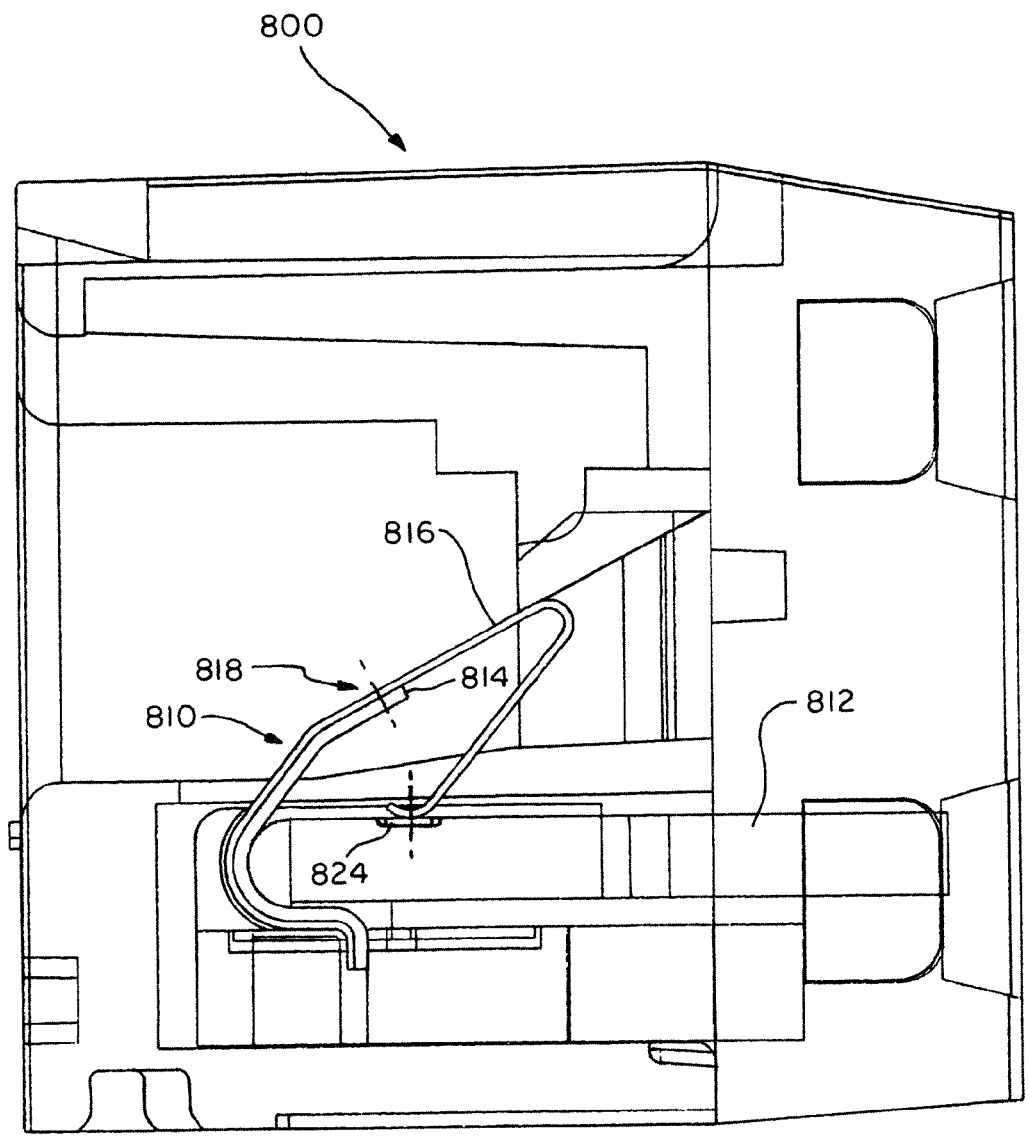
FIG. 8 shows a cross-sectional view of a jack before insertion of a plug into the jack according to one embodiment.

FIG. 8 is a cross-sectional view of a communication jack 800 according to another embodiment of the present invention. The plug interface contacts 810 include conductive layers 814, 816 of unequal lengths and thicknesses. In the embodiment of FIG. 8, the bottom conductive layer 814 is thicker than the top conductive layer 816 and provides the majority of the mechanical force for the plug interface contact 810. The bottom conductive layer 814 terminates near the plug/jack interface 818. The top conductive layer 816 extends from the plug/jack interface 818 further into the cavity 808 than the bottom conductive layer 814. The top conductive layer 816 extends from the plug/jack interface 818 towards the rear of the jack 800, where the top conductive layer 816 bends such that the top contact layer 816 forms an acute angle. The top conductive layer 816 contacts a contact pad 824 of a horizontally-disposed PCB 812.

Figure 9:
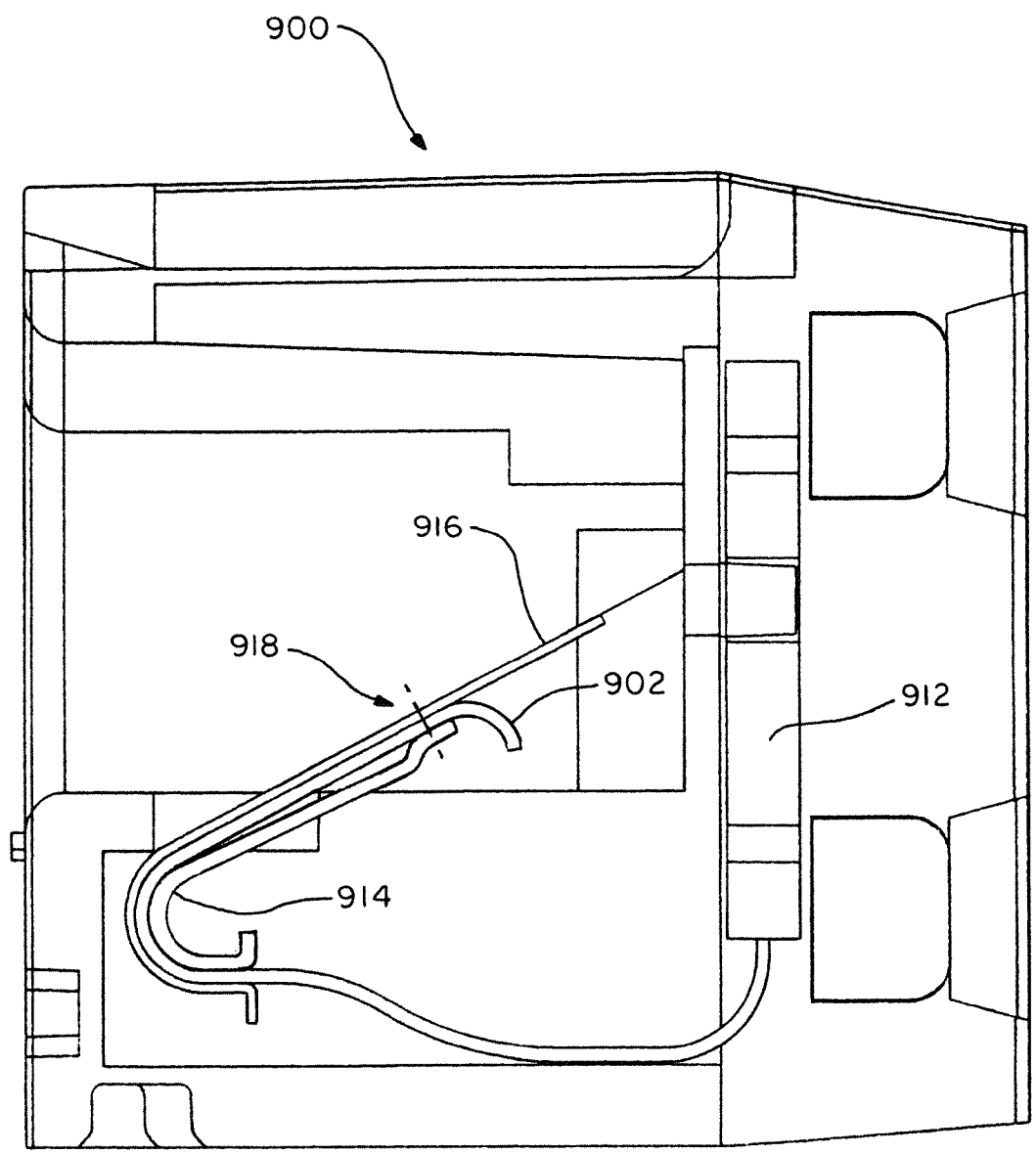
FIG. 9 shows a cross-sectional view of a jack before insertion of a plug into the jack according to one embodiment.

FIG. 9 illustrates a cross-sectional view of another embodiment of a jack 900. The plug interface contacts 910 include conductive layers 914, 916 of unequal lengths and thicknesses. The conductive layers 914, 916 are separated by an FPC 902. The bottom conductive layer 914 is thicker than the top conductive layer 916 and provides the majority of the mechanical force for the plug interface contact 910. The bottom conductive layer 914 terminates near the plug/jack interface 918.

The FPC 902 is disposed between the conductive layers 914, 916 throughout the length of the conductive layers 914, 916. The FPC 902 is connected at one end to a vertically-disposed PCB 912, similarly to the embodiment shown in FIG. 7. The bottom conductive layer 914 is shorter than the top conductive layer 916. The top conductive layer 916 communicates with the FPC 902 at the plug/jack interface 918 through contact pads on the FPC 902. The bottom conductive layer 914 is formed to separate slightly from the FPC 902 away from the plug/jack interface 918 and has a flat raised area 922 that contacts contact pads/traces of the FPC 902 at the plug/jack interface 918. The raised area 922 increases the normal force of the bottom contact 914 at the plug/jack interface 918. The FPC 902 also extends farther than the raised area 902 of the bottom conductive layer 914, which allows inter-contact capacitance to be added on the end of the FPC 902 near the plug/jack interface 918.

Figure 10:
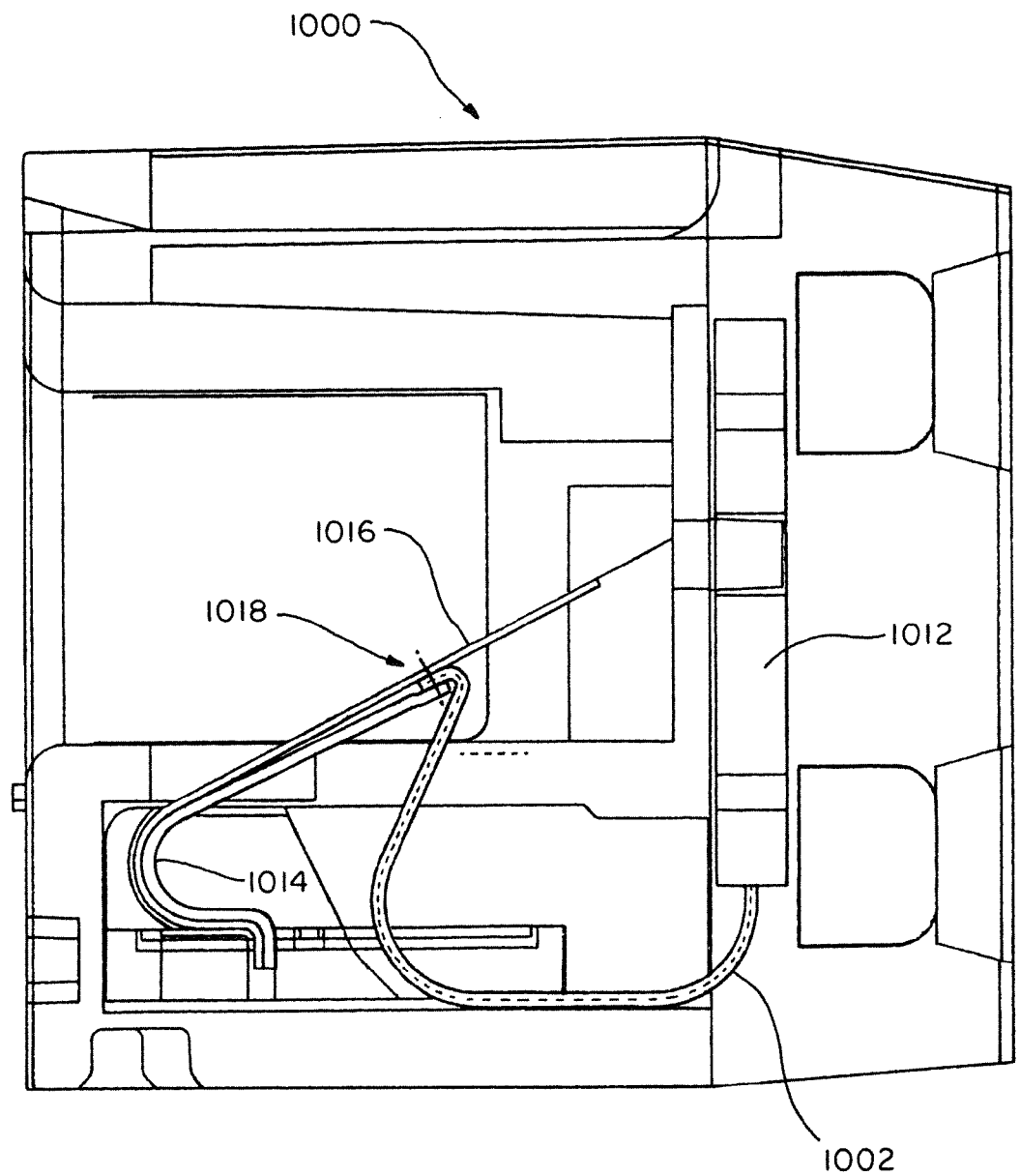
FIG. 10 shows a cross-sectional view of a jack before insertion of a plug into the jack according to one embodiment.

FIG. 10 illustrates a cross-sectional view of another embodiment of a jack 1000. The plug interface contacts 1010 include conductive layers 1014, 1016 of unequal lengths and thicknesses. The conductive layers 1014, 1016 are in contact for at least some of the region between the plug/jack interface 1018 and the end retained in the sled 1004. The bottom conductive layer 1014 is thicker than the top conductive layer 1016 and provides the majority of the mechanical force for the plug interface contact 1010. The bottom conductive layer 1014 terminates near the plug/jack interface 1018, while the top conductive layer 1016 extends farther into the cavity 1008 of the jack 1000.

An FPC 1002 is disposed between the conductive layers 1014, 1016 essentially only at the plug/jack interface 1018. The FPC 1002 is connected at one end to a vertically-disposed PCB 1012. The top conductive layer 1016 communicates with the FPC 1002 at the plug/jack interface 1018 through contact pads on the FPC 1002. The bottom conductive layer 1014 is separated slightly from the top conductive layer 1016 due to the FPC 1002 disposed at the plug/jack interface 1018. Alternatively, the bottom conductive layer may contain a raised area, similarly to the above. The FPC 1002 contains current-carrying traces and capacitive areas.

Figure 11:
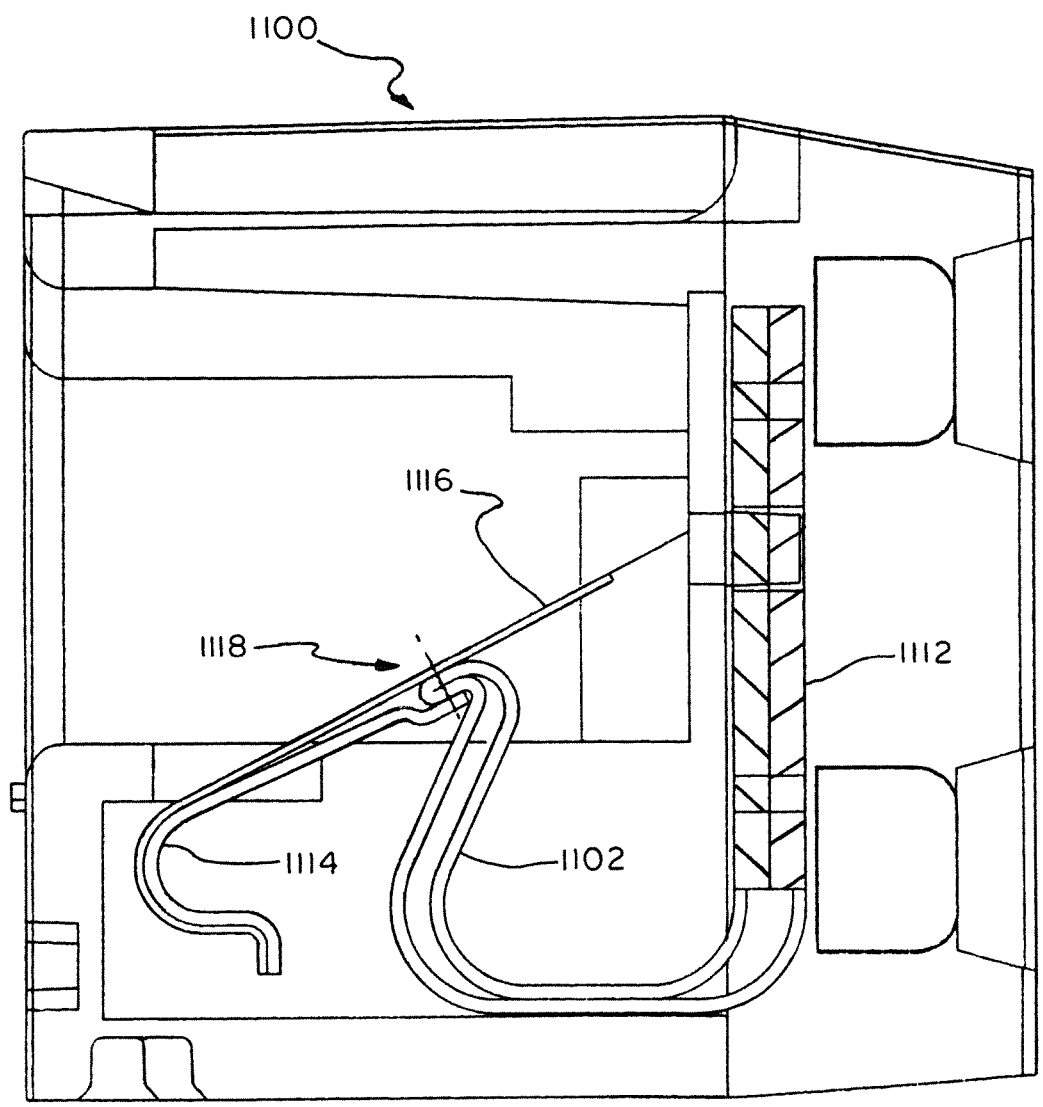
FIG. 11 shows a cross-sectional view of a jack before insertion of a plug into the jack according to one embodiment.

FIG. 11 illustrates a cross-sectional view of another embodiment of a jack 1100. The plug interface contacts 1110 include conductive layers 1114, 1116 of unequal lengths and thicknesses. The bottom conductive layer 1114 is thicker than the top conductive layer 1116 and provides the majority of the mechanical force for the plug interface contact 1110. The bottom conductive layer 1114 terminates near the plug/jack interface 1118. The top conductive layer 1116 extends farther than the bottom conductive layer 1114.

An FPC 1102 is disposed between the conductive layers 1114, 1116 at the plug/jack interface 1118. The bottom conductive layer 1114 is separated slightly from the FPC 1102 away from the plug/jack interface 1118 and has a flat offset 1122 that contacts the FPC 1102 at the plug/jack interface 1118.

The FPC 1102 is doubled on itself and connected at both ends to one or more vertically-disposed PCBs 1112. The FPC 1102 may be attached to the PCB 1112 via solder at each end of the FPC 1102. The doubling over of the FPC 1102 provides permits the use of four layers of traces while maximizing the flexibility of the assembly. The offset 1122 provides enough separation to permit the doubled FPC 1102 to fit between the top conductive layer 1116 and the bottom conductive layer 1114.

Figure 12:
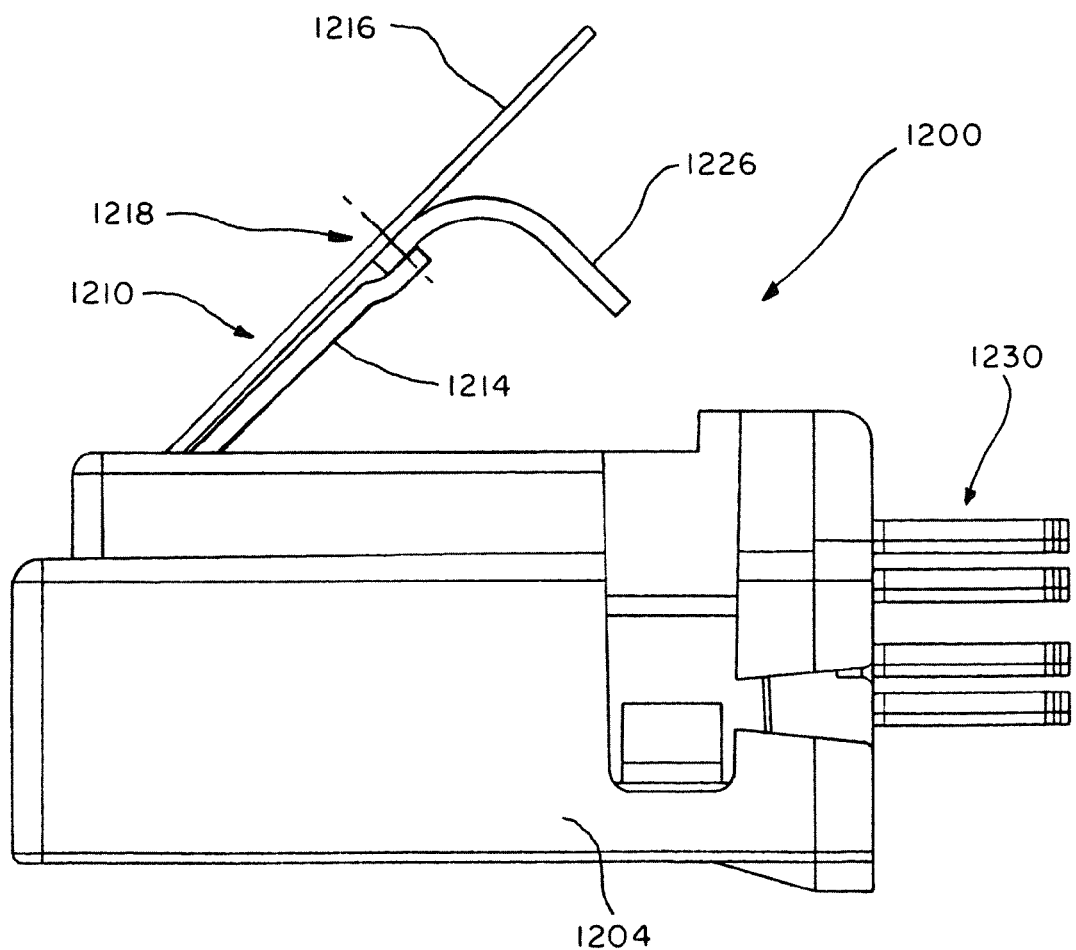
FIG. 12 shows a cross-sectional view of a contact assembly of a jack according to one embodiment.

FIG. 12 illustrates a cross-sectional view of a contact assembly 1200 of a jack according to one embodiment. The contact assembly 1200 includes a body 1204 from which plug interface contacts 1210 extend. The plug interface contacts 1210 include conductive layers 1214, 1216 of unequal lengths and thicknesses. The plug interface contacts 1210 are retained by the body 1204. The conductive layers 1214, 1216 extend from a plug/jack interface 1218 to an end retained in the body 1204. The plug interface contacts 1210 are connected to pins 1230 that extend from the body 1204. The conductive layers 1214, 1216 are in contact for at least some of the region between the plug/jack interface 1218 and the end retained in the body 1204. The bottom conductive layer 1214 is thicker than the top conductive layer 1216 and provides the majority of the mechanical force for the plug interface contact 1210. The bottom conductive layer 1214 terminates near the plug/jack interface 1218, while the top conductive layer 1216 extends farther than the bottom conductive layer 1214. A flexible capacitor 1226 is disposed between the conductive layers 1214, 1216 at the plug/jack interface 1218. This reduces the distance between the plug/jack interface 1218 and the capacitance of the capacitor 1226.

Figure 13:
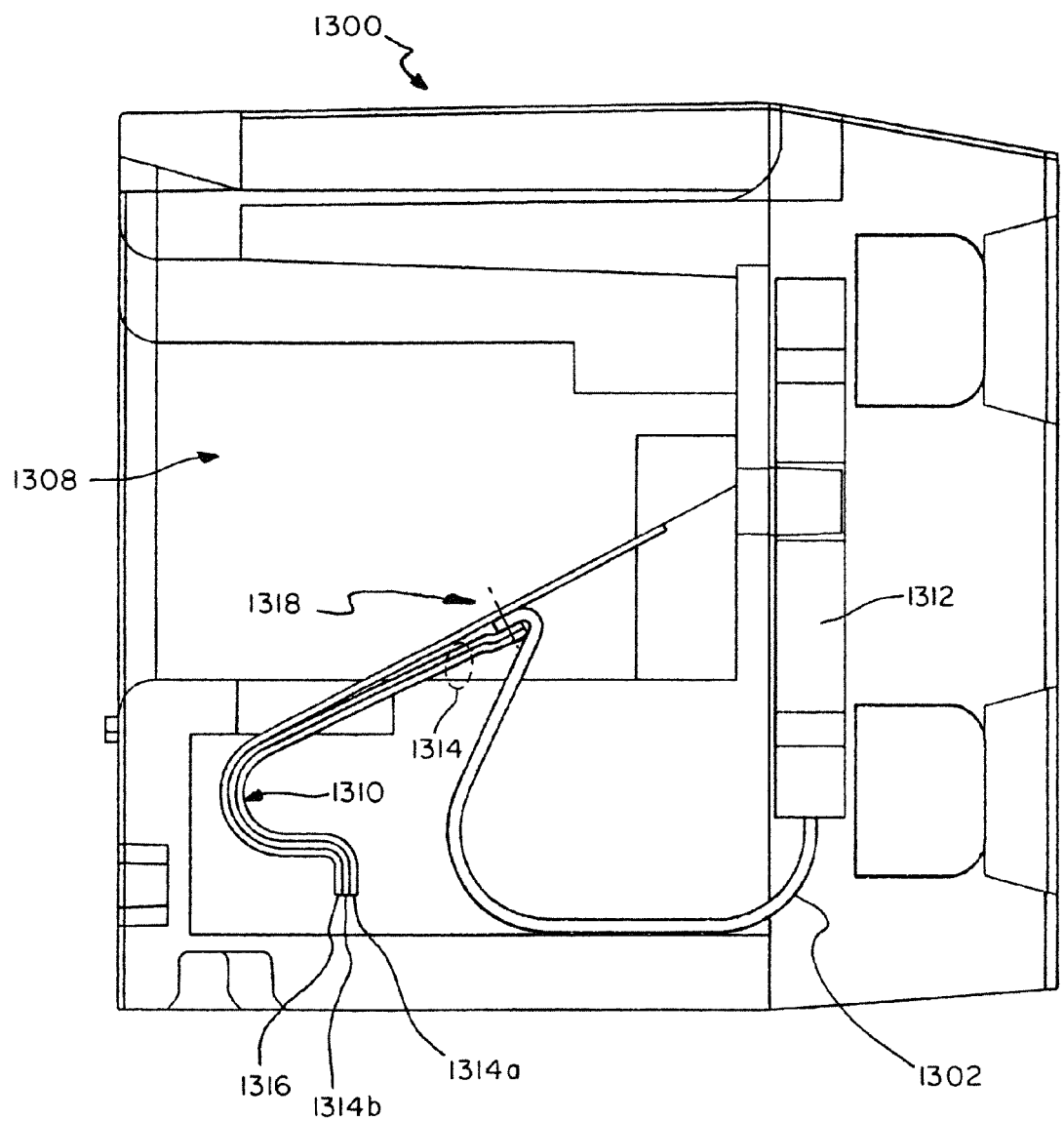
FIG. 13 shows a cross-sectional view of a jack before insertion of a plug into the jack according to one embodiment.

FIG. 13 illustrates a cross-sectional view of another embodiment of a jack 1300, which is similar to the embodiment shown in FIG. 11. The plug interface contacts 1310 include conductive layers 1314, 1316 of unequal lengths and thicknesses. The conductive layers 1314, 1316 are in contact for at least some of the region between the plug/jack interface 1318 and the end retained in the sled. The bottom conductive layer 1314 is formed from equal thickness sub-layers 1314*a*, 1314*b*. The thickness of each of the sub-layers 1314*a*, 1314*b* is about equal to that of the top conductive layer 1316. Thus, the bottom conductive layer 1314 has about twice the thickness of the top conductive layer 1316 and provides the majority of the mechanical force for the plug interface contact 1310. In other embodiments, the relative thicknesses of the top conductive layer 1316 and each of the sub-layers 1314*a*, 1314*b* may be altered as desired. For example, the sub-layers 1314*a*, 1314*b* may have the same thickness or may have different thicknesses, and one or both of the sub-layers 1314*a*, 1314*b* may have a different thickness than the top conductive layer 1316. The bottom conductive layer 1314 terminates near the plug/jack interface 1318, while the top conductive layer 1316 extends farther into the cavity 1308 of the jack 1300.

An FPC 1302 is disposed between the conductive layers 1314, 1316 only at the plug/jack interface 1318. The FPC 1302 is connected at one end to a vertically-disposed PCB 1312. The bottom conductive layer 1314 is shorter than the top conductive layer 1316. When a plug (not shown) is inserted into the cavity 1308, the plug contacts (not shown) of the plug communicate with the FPC 1302 at the plug/jack interface 1318 through contact pads on the FPC 1302. The bottom conductive layer 1314 is separated slightly from the top conductive layer 1316 due to the FPC 1302 disposed at the plug/jack interface 1318.

As indicated above, the features of any of the above embodiments may be combined in any manner possible. The various embodiments of the jack may be used in any device such as communications equipment. For example, it may be beneficial to incorporate the jack in a wall outlet, an end-user device such as a computer, a mid-span device such as a patch panel, or a network device such as a network manager.

It will be appreciated that various of the above-disclosed and other features and functions, or alternatives thereof, may be desirably combined into many other different systems or applications. For example, "a" may denote the use of one or more elements. The lists presented herein are intended to be exemplary rather than limiting. Also, variations presently unforeseen or unanticipated alternatives, modifications, variations or improvements therein may be subsequently made by those skilled in the art, and are also intended to be encompassed by the following claims.

What is claimed is:

1. A communications jack configured to accept a communication plug, the jack comprising:
    a cavity configured to accept the communication plug; and
    a plurality of plug interface contacts that extend into the cavity such that the plug in the cavity makes electrical contact with the plug interface contacts, at least one of the plug interface contacts formed of individual layered conductive strips wherein adjacent surfaces of the individual layered conductive strips contact each other along substantially an entire surface area of the adjacent surfaces, wherein the at least one of the plug interface contacts consists of the plug interface contacts most proximate to sides of the jack.

2. The communications jack of claim 1, wherein the adjacent surfaces contact each other along substantially the entire surface area of the adjacent surfaces when the plug is not inserted into the communications jack.

3. The communications jack of claim 1, wherein the individual layered conductive strips are formed of the same material.

4. The communications jack of claim 1, wherein the individual layered conductive strips are all of the same thickness.

5. The communications jack of claim 1, wherein each of the plug interface contacts of the plurality of plug interface contacts is formed of individual layered conductive strips.

* * * * *